United States Patent
Szulczyk

(10) Patent No.: US 9,147,507 B2
(45) Date of Patent: Sep. 29, 2015

(54) NBTI SUPERCONDUCTOR WITH REDUCED WEIGHT

(71) Applicant: Bruker EAS GmbH, Hanau (DE)

(72) Inventor: Andreas Szulczyk, Linsengericht (DE)

(73) Assignee: Bruker EAS GmbH, Hanau (DE)

(*) Notice: Subject to any disclaimer, the term of this patent is extended or adjusted under 35 U.S.C. 154(b) by 276 days.

(21) Appl. No.: 13/847,497

(22) Filed: Mar. 20, 2013

(65) Prior Publication Data

US 2014/0155270 A1 Jun. 5, 2014

(30) Foreign Application Priority Data

Apr. 11, 2012 (DE) .......................... 10 2012 205 843

(51) Int. Cl.
| | | |
|---|---|---|
| H01B 12/00 | (2006.01) | |
| H01L 39/00 | (2006.01) | |
| H01B 12/10 | (2006.01) | |
| H01L 39/14 | (2006.01) | |
| H01L 39/24 | (2006.01) | |

(52) U.S. Cl.
CPC ................ *H01B 12/10* (2013.01); *H01L 39/14* (2013.01); *H01L 39/2406* (2013.01)

(58) Field of Classification Search
CPC ..... H01L 39/12; H01L 39/14; H01L 39/2406; H01L 39/2409; H01B 12/06; H01B 12/10; H01B 13/00; Y10S 505/806; Y10S 505/887; Y02E 40/642; Y02E 40/644

USPC .......... 505/230, 231, 232, 430, 431; 428/652; 174/125.1; 29/599; 148/96

See application file for complete search history.

(56) References Cited

U.S. PATENT DOCUMENTS

| | | | | |
|---|---|---|---|---|
| 4,506,109 | A * | 3/1985 | Onishi et al. ............... | 174/125.1 |
| 4,652,697 | A * | 3/1987 | Ando et al. ................ | 174/125.1 |
| 5,088,183 | A * | 2/1992 | Kanithi ........................ | 29/599 |
| 5,189,386 | A | 2/1993 | Tada | |
| 2009/0038822 | A1 | 2/2009 | Thoener | |

FOREIGN PATENT DOCUMENTS

| | | |
|---|---|---|
| JP | 09 282 953 | 10/1997 |
| WO | WO 2008/121764 | 10/2008 |

* cited by examiner

*Primary Examiner* — Colleen Dunn
(74) *Attorney, Agent, or Firm* — Paul Vincent

(57) ABSTRACT

A superconducting wire (12), containing NbTi superconducting material and Cu, comprising a multiplicity of hexagonal elements, which, as seen in cross-section perpendicular to the longitudinal direction of the superconducting wire (12), have an at least approximately hexagonal outside contour is characterized in that at least a portion of the hexagonal elements is constituted as Cu—Al composite elements (3), wherein, in cross-section perpendicular to the longitudinal direction of the superconducting wire (12), the Cu—Al composite elements (3) are each constituted with an Al core (4) and a Cu sheath (5) that surrounds the Al core (4). The NbTi superconducting wire is thereby stabilized and has low weight as well as a reduced risk of crack formation during manufacturing, especially during wire drawing.

15 Claims, 8 Drawing Sheets

NBTI SUPERCONDUCTOR WITH REDUCED WEIGHT

This application claims Paris Convention priority of DE 10 2012 205 843.5 filed Apr. 11, 2012 the complete disclosure of which is hereby incorporated by reference.

BACKGROUND OF THE INVENTION

The invention relates to a superconducting wire, containing NbTi superconducting material and Cu, comprising a multiplicity of hexagonal elements, which have an at least approximately hexagonal outside contour, as seen in cross-section perpendicular to the longitudinal direction of the superconducting wire.

Such a superconducting wire is disclosed in U.S. Pat. No. 5,088,183 A.

Niobium-titanium (NbTi) is an important superconducting material, which, due to its good plastic deformability (both as a final material and with respect to its precursors), can be deployed in a variety of ways, for example, in superconducting magnet coils or in superconducting cables. The NbTi superconducting material is typically integrated in a superconducting wire, wherein a multiplicity of NbTi filaments usually extend in the longitudinal direction of the superconducting wire.

The wire manufacturing process usually includes, as part of a drawing process, plastic deformation into a hexagonal outside cross-section in order to simplify the bundling process of individual NbTi filaments (or also other structures and intermediate structures). The resulting hexagonal elements can then be very compactly disposed, for example, in a copper enclosing tube, cf. U.S. Pat. No. 5,088,183 A referred to above.

The superconducting properties of NbTi are only achieved at especially low temperatures, below approx. 9 K, so that the superconductor must be cooled, for example, with liquid helium. Moreover, the superconducting condition cannot be maintained if the magnetic field strength or the electric current density is too high.

NbTi superconducting wires are typically stabilized with copper (Cu), usually with a high degree of purity. The copper runs parallel with the superconducting filaments in the superconducting wire; for example, the copper can constitute a matrix for superconducting NbTi filaments. Copper is a good heat conductor, through which effective cooling of the superconducting NbTi filaments can be achieved. Furthermore, copper exhibits high electrical conductivity. If superconductivity in the superconducting wire is lost locally, the copper provides a parallel electrical current path, limiting a rise in electrical resistance and the associated heat generation. With effective cooling, superconductivity can be restored to the local, normally conducting region in the superconductor (stabilizing function). Even if superconductivity cannot be recovered, the copper protects the superconductor from damage ("melting") by limiting the increase in resistance and thus limiting heat generation, while also efficiently removing the resulting heat (quench protection). Moreover, the copper improves the mechanical strength of the superconducting wire.

Copper is not only an expensive material, it is also relatively heavy with a density of approx. 8.9 $g/cm^3$, which is undesirable for many applications. Alternative materials for stabilizing NbTi superconductors are therefore sought that can at least partially replace copper. Pure aluminum (Al) would be a suitable material in terms of heat conductivity and electrical resistance, and is less expensive than copper and, with a density of 2.7 $g/cm^3$, considerably lighter.

WO 2008/121764 A1 proposes a NbTi superconductor structure with a Cu sleeve, an Al core and multifilament NbTi rods disposed in a ring between them.

While Cu and NbTi are both relatively hard and behave in a similar way when plastically deformed, Al is much softer than NbTi and Cu. When wire containing Al structures is drawn, in particular, an Al core, cracks that run transverse to the longitudinal direction of the wire have been observed in the NbTi superconducting wire. A wire containing cracks is of no use for superconductor applications.

U.S. Pat. No. 5,189,386 discloses a superconductor structure in which an Al core is divided into six sectors by Cu—Ni alloy layers. This structure is relatively complex.

U.S. Pat. No. 4,652,697 describes a superconductor structure in which three Al wires and four multifilament wires are bundled, for example, with NbTi filaments and a copper matrix. One of the multifilament wires is disposed in the center of the superconductor structure. The structure is held together with PbSn solder. It is difficult to process solder in wire production and, as an additional material, it can additionally aggravate the problem of crack formation.

JP 09 282953 A describes a $Nb_3Al$ superconductor wire in which $Nb_3Al$ filaments are embedded in a copper matrix. Embedded additional structures made of Nb or Ta can be used for strengthening. In one embodiment, additional structures with an Al rod in a Cu tube are proposed.

The object of the invention is to propose a stabilized NbTi superconducting wire, which has low weight and which, in the manufacturing process, especially during wire drawing, reduces the risk of crack formation.

SUMMARY OF THE INVENTION

This object is achieved with a superconducting wire of the type mentioned above, characterized in that at least a portion of the hexagonal elements is constituted as Cu—Al composite elements, wherein, in cross-section perpendicular to the longitudinal direction of the superconducting wire, the Cu—Al composite elements are each constituted with an Al core and a Cu sheath that surrounds the Al core.

The invention proposes partially replacing copper for the stabilization of the NbTi superconducting material with aluminum, wherein a special hybrid construction is proposed, which, in the case of plastic deformation processes that occur when an NbTi superconducting wire is drawn, is particularly suitable for reforming and prevents or avoids the formation of cracks.

According to the invention, the aluminum is introduced into the Cu—Al composite elements, wherein the aluminum constitutes a core, and copper completely surrounds the Al core (as seen in cross-section perpendicular to the longitudinal direction of the wire). The Cu—Al composite elements can also be termed Cu-clad Al elements. The Cu—Al composite elements are integrated in the inventive superconducting wire.

The Al cores of Cu—Al composite elements are mutually separated at least by the Cu sheaths (Cu cladding) so that, in each case, only relatively small contiguous contact surfaces of Al and Cu are formed. This limits the local mechanical stress that occurs during reforming (in particular, during wire drawing) at the Cu/Al interfaces. The contact surface between Al and Cu is inventively distributed across many Cu—Al composite elements.

Furthermore, direct contact between Al cores and NbTi structures is precluded, eliminating Al/NbTi interfaces as a source of mechanical stress during reforming.

By using a multiplicity of Cu—Al composite elements in the inventive superconducting wire, the weight per meter (i.e. the mass of the superconducting wire per length in the longitudinal direction) can be considerably reduced as compared with the exclusive use of copper to stabilize the superconducting material.

By constituting the Cu—Al composite elements as hexagons, they can be easily integrated into an inventive superconducting wire. The hexagonal Cu—Al composite elements can then be disposed in a very compact way (typically in bundles); in particular, cavities in the vicinity of Cu—Al composite elements are avoided. This enables a high level of control over the reforming process, so that the Cu cladding around the Al cores is usually well protected during the wire drawing process.

The inventive superconducting wire typically comprises at least 7, preferably at least 19, especially preferably at least 85 Cu—Al composite elements. The cross-section surface of an inventive superconducting wire is typically occupied by at least 15%, preferably at least 25%, especially preferably at least 35%, of Cu—Al composite elements.

The aluminum (Al) of Cu—Al composite elements typically has a high degree of purity (preferably >99 percent by weight of Al); wherein traces of dopant can be contained in the Al (for example, to introduce electrical and thermal properties), if desired. The copper (Cu) in the Cu—Al composite elements and typically also in the other superconducting wire preferably also has a high degree of purity (preferably >99 percent by weight of Cu), but can also occur in an alloy containing copper (preferably ≥80 percent by weight of Cu, especially preferably ≥90 percent by weight of Cu in the Cu alloy).

Preferably a Cu—Al composite element within the scope of the invention consists of 10-20 percent by volume of copper (or of an alloy containing copper), and of approx. 80-90 percent by volume of aluminum.

Let it be noted that the Al cores in the Cu—Al composite elements, as seen in cross-section perpendicular to the longitudinal direction of the superconducting wire, typically also have a substantially hexagonal contour. Overall, the inventive superconducting wire typically has a substantially circular cross-section, but can have another contour, for example, a hexagonal contour.

In an advantageous embodiment of an inventive superconducting wire, the superconducting wire, as seen in cross-section perpendicular to the longitudinal direction of the superconducting wire, has at least three Cu—Al sectors, wherein each Cu—Al sector has a multiplicity of contiguous Cu—Al composite elements, and wherein the Cu—Al sectors are azimuthally spaced, in particular wherein the Cu—Al sectors are disposed in an azimuthally evenly distributed fashion. The Cu—Al sectors are typically separated from one another by NbTi elements (see below) in the azimuthal direction. The azimuthal spacing between the sectors creates regions of low stress that prevent the formation of cracks. In particular, mechanical stress resulting from reforming processes in the azimuthal direction (circumferential direction of the wire) can only build up over short distances.

A variant of this embodiment is preferred in which at least three Cu—Al sectors border onto a central Cu—Al sector, which exhibits a multiplicity of contiguous Cu—Al composite elements and whose cross-section is perpendicular to the longitudinal direction of the superconducting wire at the center of the superconducting wire. By using the center of the superconducting wire as a Cu—Al central sector, additional cross-sectional area is available for using Al instead of Cu.

Also advantageous is an embodiment that has a superconducting wire which, as seen in cross-section perpendicular to the longitudinal direction of the superconducting wire, has at least three Cu—Al clusters separated from one another, wherein each Cu—Al cluster has a multiplicity of contiguous Cu—Al composite elements. Seen in cross-section, the Cu—Al clusters are not contiguous; they are typically separated by NbTi elements and/or by a shaped tube (see below). By separating the Cu—Al clusters, regions of low stress are created that prevent the formation of cracks. In particular, mechanical stress caused by reforming processes can only be built up over short distances.

Especially preferred is an embodiment in which a portion of the hexagonal elements is constituted as NbTi elements, wherein the NbTi elements each have one or more NbTi filaments. The NbTi elements can be handled easily and, in particular, can be disposed very compactly in the superconducting wire, especially in combination with the Cu—Al composite elements. The NbTi elements are regularly free of aluminum. It is important to note that, in the case of multiple-stage bundling and drawing processes, hexagonal elements can themselves contain hexagonal elements.

In a preferred embodiment, the NbTi elements each have a Cu matrix and/or a Cu enclosure. The Cu matrix or the Cu enclosure stabilizes the NbTi filament(s) in terms of superconductivity; in the reforming processes, no problems are to be expected (in particular, no cracks) due to the similar material properties of Cu and NbTi. The Cu matrix and/or the Cu enclosure also provide a certain amount of mechanical stabilization.

In another embodiment, the superconducting wire, as seen in cross-section perpendicular to the longitudinal direction of the superconducting wire, has at least three NbTi sectors, wherein each NbTi sector has a multiplicity of contiguous NbTi elements, and wherein the NbTi sectors are azimuthally spaced. In the azimuthal direction (circumferential direction of the wire), the NbTi sectors are typically separated from one another by Cu—Al composite elements. With NbTi sectors, extensive regions can be established in which, even after a reforming process, no significant mechanical stress can occur. This limits overall stress in the superconducting wire.

An embodiment is also preferred in which the superconducting wire, as seen in cross-section perpendicular to the longitudinal direction of the superconducting wire, contains a central region that contains Al. By using the central region of the superconducting wire as a Cu—Al central sector, further cross-sectional area is available for using Al instead of Cu.

An embodiment is advantageous in which the central region has a multiplicity of contiguous Cu—Al composite elements. By using Cu—Al composite elements, mechanical stress after reforming processes is limited in the central region.

An embodiment is also preferred in which a shaped tube, in particular, a Cu shaped tube, delimits the central region. Seen in cross-section, the inside and/or outside of the shaped tube has contours for applying hexagonal elements. A Cu—Al central cluster composed of contiguous Cu—Al composite elements can disposed inside the shaped tube. The shaped tube permits mechanical stabilization of the superconducting wire; this also makes it easier to join the superconducting wire.

In an advantageous embodiment, the superconducting wire has a sleeve, in particular, a Cu sleeve, into which multiple mutually separated NbTi substructures are embedded, wherein each NbTi substructure has one or more NbTi filaments. The NbTi substructures can, in particular, have a round cross-section. The sleeve is used as a matrix for the NbTi substructures. This structure is particularly mechanically stable.

An embodiment is preferred in which the NbTi substructures are azimuthally evenly distributed.

In a further embodiment, the NbTi substructures can be at an equal radial distance from the center of the superconducting wire. Alternatively, the NbTi substructures can be distributed over two or more radial distances, wherein, in each case, six or more NbTi substructures are at an equal radial distance from the center of the superconducting wire. A symmetrical structure makes the superconducting wire particularly stable.

Finally, another embodiment is preferred in which the superconducting wire comprises an external enclosing tube, in particular, a Cu enclosing tube. The enclosing tube provides good mechanical stabilization of the superconducting wire. By simple means, one or more bundles of hexagonal elements can also be disposed inside the enclosing tube.

Further advantages result from the description and the drawing. Moreover, the features stated above and further below can be used singly or together in any combination. The embodiments shown and described are not intended to be an exhaustive list but are rather examples to explain the invention.

The invention is shown in the drawing and is explained in more detail using embodiments. The figures show:

DESCRIPTION OF THE PREFERRED EMBODIMENT

Overview of the Invention

This invention proposes integrating aluminum in an NbTi superconducting wire, wherein the Al is inserted in copper-clad Al rods, also called Cu—Al composite elements. In this way, mechanical stress during cold work and/or wire drawing, which results from differing resistance to deformation of soft Al on the one hand and of hard NbTi and Cu on the other hand, can at least partially be absorbed or compensated for. In the inventive structure of the superconducting wire, hard and soft material often alternates (especially, in the circumferential direction of the wire), and large (in particular, circumferential) contact surfaces between hard Cu (and NbTi) on the one hand, and Al on the other hand, are avoided.

Within the scope of the invention, almost any number of NbTi filaments can be integrated into a superconducting wire without causing the formation of cracks as part of cold work processes (for instance, during wire drawing). This is especially important because optimization heat treatment (at approximately 350-400° C.) is not possible with NbTi—Al composite material, because at the associated temperatures, recrystallization processes begin and/or intermetallic phases occur, which impede superconductivity. On the other hand, conductivity can be regularly improved by cold work and/or wire drawing (so-called APC material, APC=artificial pinning center). According to this invention, NbTi APC material is preferably used.

Aluminum has a low specific weight, so that replacing Cu with Al saves weight in the superconducting wire, which is particularly advantageous in larger structures (for example, power cables for offshore wind farms). Moreover, aluminum has good electrical conductivity and is therefore a good (low-resistance) shunt resistor. With Al, high residual resistance ratios (RRR values) are possible, approx. 3000-5000 if the aluminum is very pure, which is considerably higher than the RRR values of approx. 100-400 that can be achieved with Cu.

Within the scope of this invention, Cu is not fully replaced with Al but only partially, so that the remaining copper can still contribute to the good mechanical strength of the superconducting wire.

Hexagonal Elements

In an inventive superconducting wire, hexagonal elements are used that are usually introduced into the superconducting wire as bundles; typically, the superconducting wire, after introduction of the hexagonal elements (and any other structures), is drawn once again.

At least a portion of the hexagonal elements in an inventive superconducting wire is constituted as Cu—Al composite elements. Typical production of a Cu—Al composite element is illustrated in FIG. 1.

Figure 1:
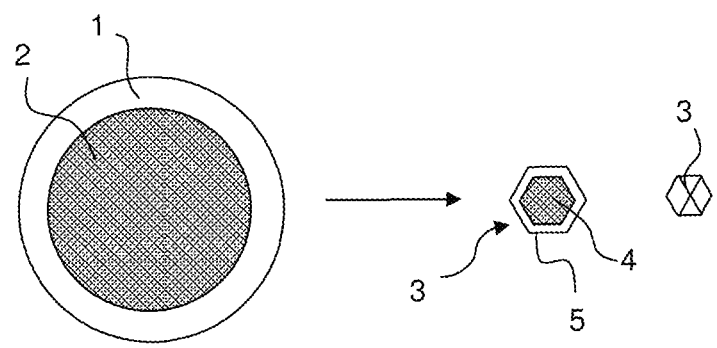
FIG. 1 A schematic representation of the production of a Cu—Al composite element (shown in cross-section perpendicular to the longitudinal direction)

A round aluminum rod 2 is inserted into a round copper tube 1 (tube 1 and rod 2 extend perpendicular to the drawing plane in FIG. 1, which, like all the subsequent figures, shows the cross-section). Subsequently, the composite material is drawn, which reduces the cross-section. At the same time, it is pressed into a hexagonal cross-sectional shape. The resulting Cu—Al composite element 3 then has an Al core 4 and a Cu sheath 5 that completely surrounds the latter (in cross-section), both of which have a hexagonal (outside) cross-section. In the subsequent figures, the Cu—Al composite elements 3 are depicted simplified as a hexagon with a cross X (see illustration on right in FIG. 1).

In addition to the drawing method described in FIG. 1, a Cu—Al composite element can also be manufactured, for example, by extrusion.

In many embodiments of the invention, NbTi elements are also used. NbTi elements also have a hexagonal cross-section and contain one or more NbTi filaments.

Figure 2:
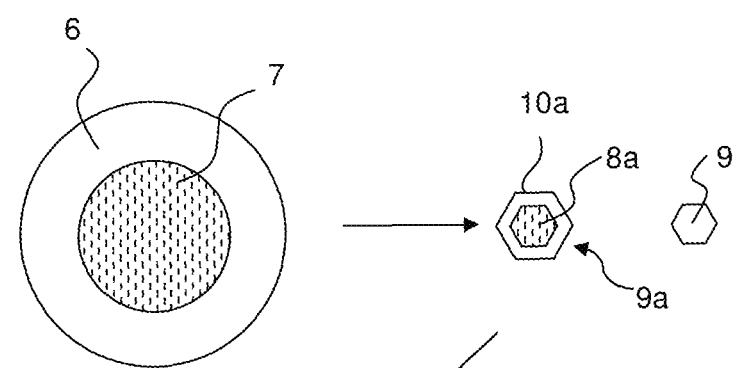
FIG. 2 A schematic representation of the production of NbTi elements (shown in cross-section perpendicular to the longitudinal direction) for the invention.
Figure 2:
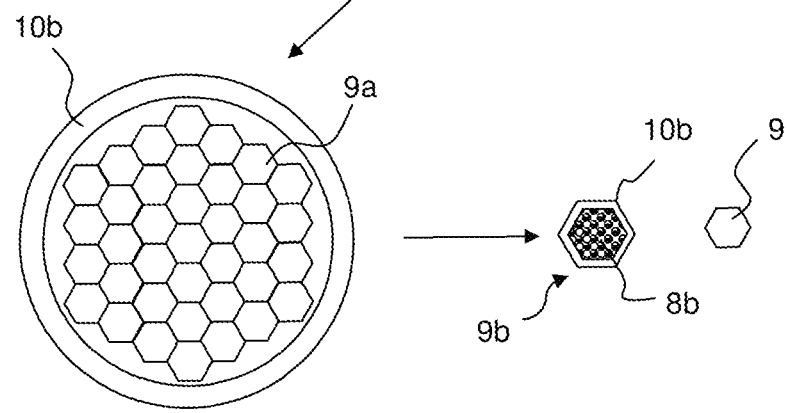

FIG. 2 illustrates the typical production of NbTi elements. An NbTi rod 7 is inserted into a round Cu enclosure 6. In a subsequent drawing process, the cross-section is reduced and pressed into a hexagonal shape. This results in a simple NbTi element 9a with an NbTi filament 8a and a Cu enclosure 10a.

If desired, several such NbTi elements 9a can be bundled and disposed in a further round Cu enclosure 10b. By means of a drawing process, the cross-section can again be reduced and pressed into a hexagonal shape, so that an NbTi element 9b containing several (37 in this case) NbTi filaments 8b in a Cu enclosure 10b is obtained.

NbTi elements of both types 9a, 9b, are represented simplified as an empty hexagon 9 in the subsequent figures (see FIG. 2, both on the right).

Embodiments of Inventive Superconducting Wires

Figure 3:
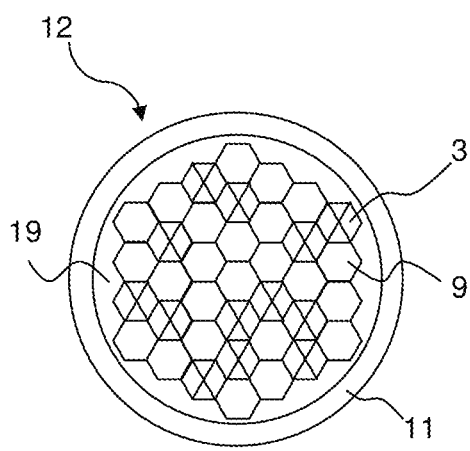
FIG. 3 A schematic cross-section (perpendicular to the longitudinal direction) through a first embodiment of an inventive superconducting wire, with a random mixture of Cu—Al composite elements and NbTi elements.

FIG. 3 shows a simple embodiment of an inventive superconducting wire 12, in which the Cu—Al composite elements 3 and NbTi elements 9 are randomly mixed in an outside Cu enclosing tube 11. The NbTi elements 9 carry the superconductor, whereas the Cu—Al composite elements 3 and the Cu enclosing tube 11 provide its stabilization. To avoid cavities, Cu filler plates 19 can be inserted between the Cu enclosing tube 11 and the hexagonal elements (Cu—Al composite elements 3 and NbTi elements 9).

Figure 4:
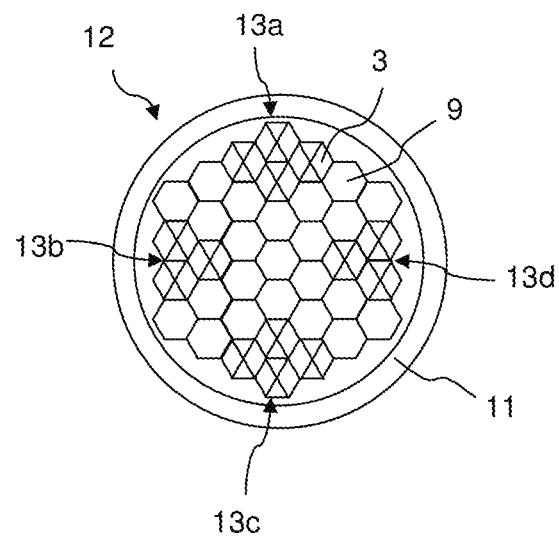
FIG. 4 A schematic cross-section (perpendicular to the longitudinal direction) through a second embodiment of an inventive superconducting wire, with four separate Cu—Al clusters.

FIG. 4 shows an embodiment of the inventive superconducting wire 12, in which the Cu—Al composite elements are grouped in four Cu—Al clusters 13a-13d. Within each cluster 13a-13d, the Cu—Al composite elements 3 of the cluster are contiguous, so that each Cu—Al composite element within the cluster is joined to every other Cu—Al composite element in the cluster either directly or via other Cu—Al composite elements of the cluster. The clusters 13a-13d are disposed mutually separated, that is, not contiguous (in particular, not interconnected via Cu—Al composite elements), and are separated from one another by NbTi elements 9. The Cu—Al clusters 13a-13d are also spaced in the azimuthal direction (circumferential direction), so that the clusters 13a-13d can also be termed Cu—Al sectors. The cluster configuration keeps regions with reforming stress to a minimum.

Figure 5:
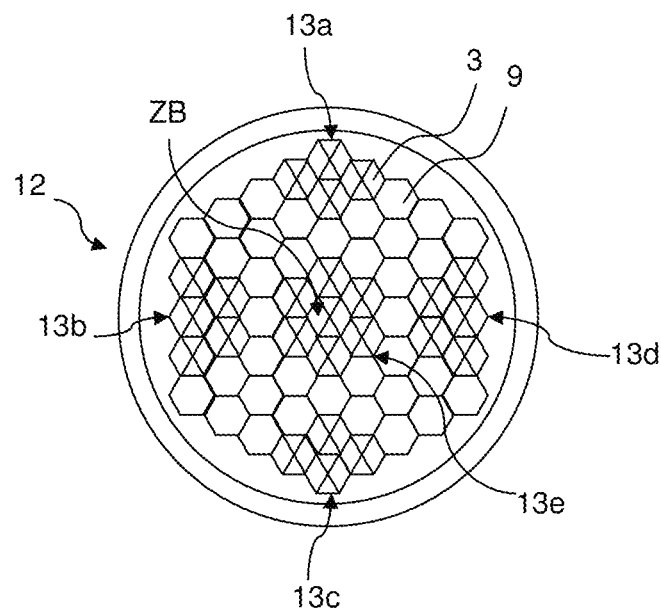
FIG. 5 A schematic cross-section (perpendicular to the longitudinal direction) through a third embodiment of an inventive superconducting wire, with five separate Cu—Al clusters including one Cl—Al cluster in the central region of the superconducting wire.

In the embodiment of the superconducting wire 12 in FIG. 5, four Cu—Al clusters 13a-13d are also provided as in the previous embodiment, and in addition, in a central region ZB, a further Cu—Al cluster 13e. The Cu—Al clusters 13a-13e are again disposed separately and are separated from one another by NbTi elements 9.

Figure 6:
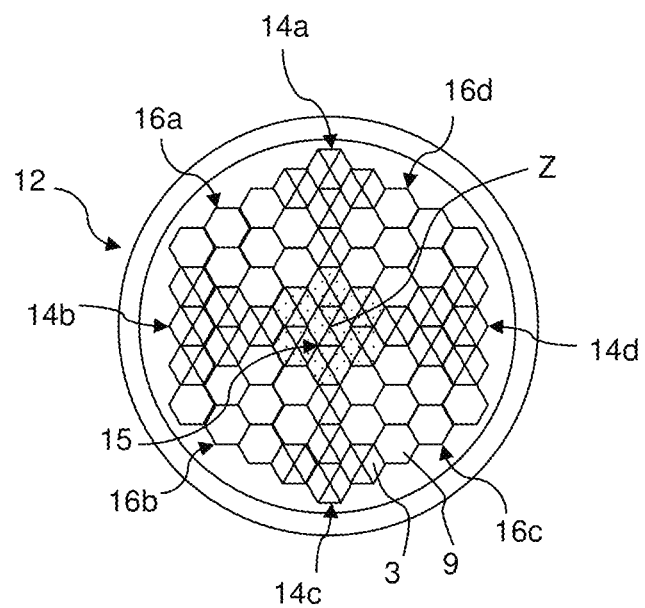
FIG. 6 A schematic cross-section (perpendicular to the longitudinal direction) through a fourth embodiment of an inventive superconducting wire, with four azimuthally separated Cu—Al sectors and one Cu—Al central sector that connects sectors.

In FIG. 6, the embodiment of the superconducting wire 12 comprises four Cu—Al sectors 14a-14d, which are composed of contiguous Cu—Al composite elements 3. The Cu—Al sectors 14a-14d are separated from one another in the azimuthal direction by NbTi sectors 16a-16d, which are composed of contiguous NbTi elements 9. Furthermore, a Cu—Al central sector 15 is provided, which is contiguous with each of the Cu—Al sectors 14a-14d. The Cu—Al central sector 15 also overlaps the center Z of the superconducting wire 12. For better visibility, the Cu—Al central sector 15 is represented by dots.

Within each sector 14a-14d, 15, the Cu—Al composite elements 3 of the sector are contiguous, so that each Cu—Al composite element within the sector is connected with every other Cu—Al composite element of the sector either directly of via other Cu—Al composite elements of the sector. Within each sector 16a-16d, the NbTi elements 9 of the sector are mutually contiguous, so that each NbTi element within the sector is joined to every other NbTi element of the sector either directly or via other NbTi elements of the sector. It is important to note that the NbTi sectors 16a-16d can also be termed NbTi clusters because not only are they spaced in the azimuthal direction but they are completely separate from one another (and not interconnected via NbTi elements). The sector configuration also keeps regions with reforming stress to a minimum.

Figure 7:
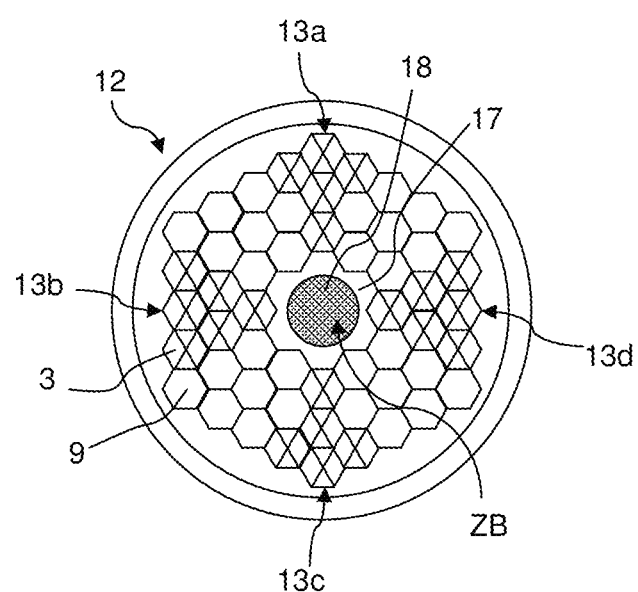
FIG. 7 A schematic cross-section (perpendicular to the longitudinal direction) through a fifth embodiment of an inventive superconducting wire, with four separate Cu—Al clusters and one Cu shaped tube, which delimits a central region of the superconducting wire and which contains an Al core.

FIG. 7 shows a further embodiment of an inventive superconducting wire 12. It comprises four Cu—Al clusters 13a-13d of contiguous Cu—Al composite elements 3. The Cu—Al clusters 13a-13d are mutually separated by NbTi elements 9 (which are here grouped into four clusters or sectors) and a Cu shaped tube 17 (and also spaced in the azimuthal direction). The Cu shaped tube 17, which delimits a central region ZB of the superconducting wire 12, has a round Al core 18 and is shaped on its outside surface in such a way that the surrounding hexagonal elements (Cu—Al composite elements 3 and the NbTi elements 9) can be disposed closely packed around its edge. It is important to note that Cu shaped tube 17 is contiguous with all four Cu—Al clusters 13a-13d.

The Al core 18 and the shaped tube 17 should not be too large to prevent stress from building up or to keep it low.

Figure 8:
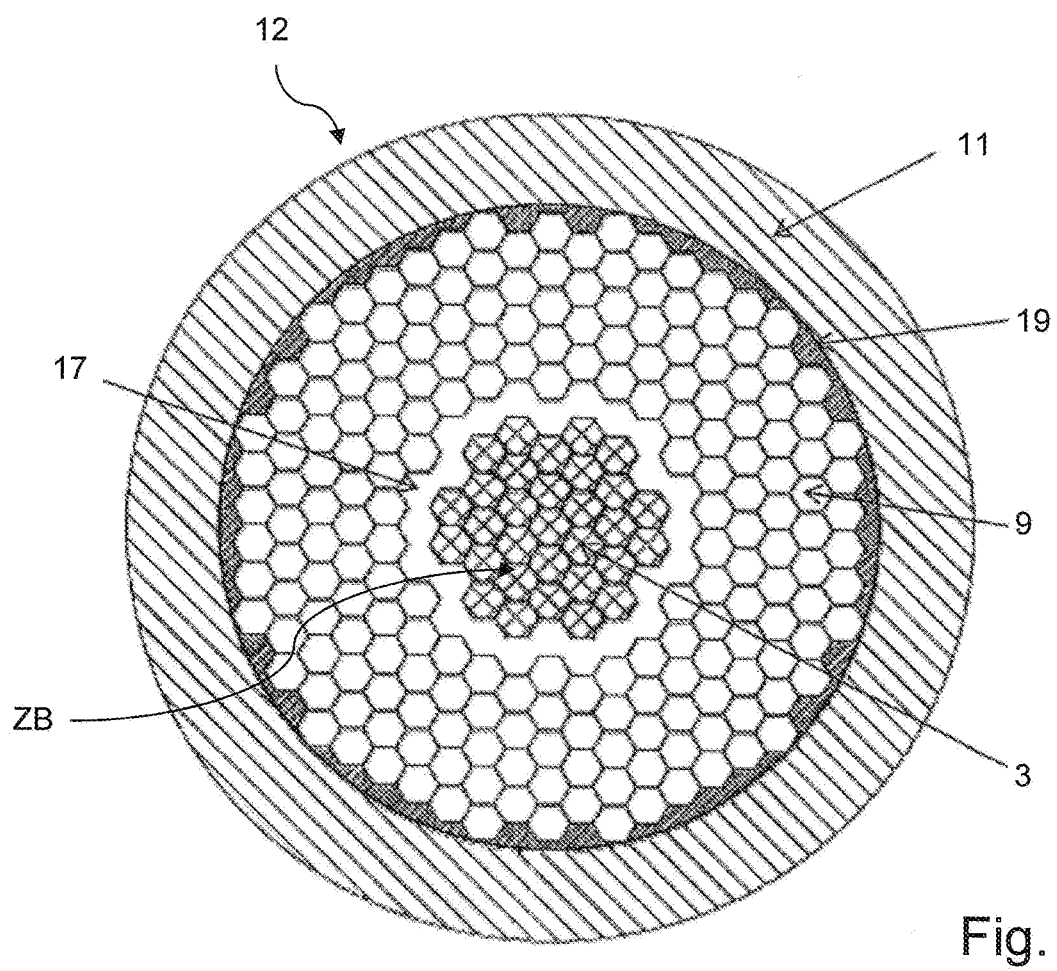
FIG. 8 A schematic cross-section (perpendicular to the longitudinal direction) through a sixth embodiment of an inventive superconducting wire, with a Cu shaped tube, shaped on the inside and outside, which contains Cu—Al composite elements.

In order to form a larger, central region ZB containing aluminum, a Cu shaped tube 17 shaped on the inside and outside as shown in the embodiment of the superconducting wire 12 of FIG. 8 can be used. Cu—Al composite elements 3 are disposed in the shaped tube 17, forming a Cu—Al central cluster, which is separated by shaped tube 17 from the NbTi elements 9 that are located further out. By disposing the Al material in the Cu—Al composite elements 3, only slight reforming stress that does not result in the formation of cracks builds up in the central region ZB, which is delimited by the Cu shaped tube 17.

Outside the shaped tube 17, no Cu—Al composite elements are disposed in the embodiment shown; however, alternatively Cu—Al composite elements 3 could be provided outside the shaped tube 17, grouped in Cu—Al clusters.

Here, the superconducting wire 12 has a Cu enclosing tube 11, with Cu filler plates 19 (shown with dark hatching) placed on its inner side to keep the NbTi elements 9 defined and compact. The Cu enclosing tube 11 and the Cu shaped tube 17 give the superconducting wire 12 good mechanical stability. The shaped tube 17 also makes the bundling process in wire production easier.

Figure 9:
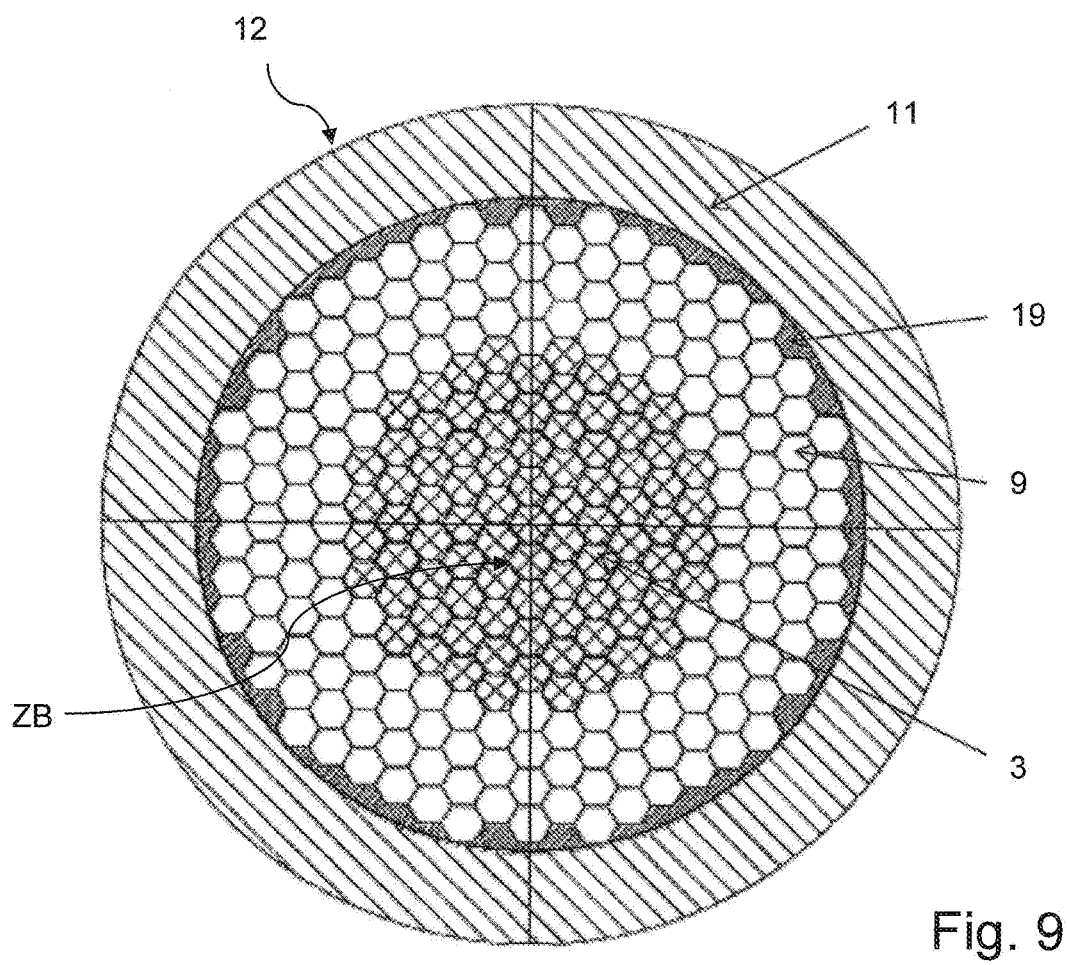
FIG. 9 A schematic cross-section (perpendicular to the longitudinal direction) through a seventh embodiment of an inventive superconducting wire, with a multiplicity of contiguous Cu—Al composite elements in a central region.

As shown in FIG. 9, alternatively it is also possible in another embodiment of the inventive superconducting wire 12 to dispose Cu—Al composite elements 3 in a central region ZB without providing a shaped tube. NbTi composite elements 9 then directly adjoin the Cu—Al central cluster, which is constituted by the Cu—Al composite elements.

Figure 10:
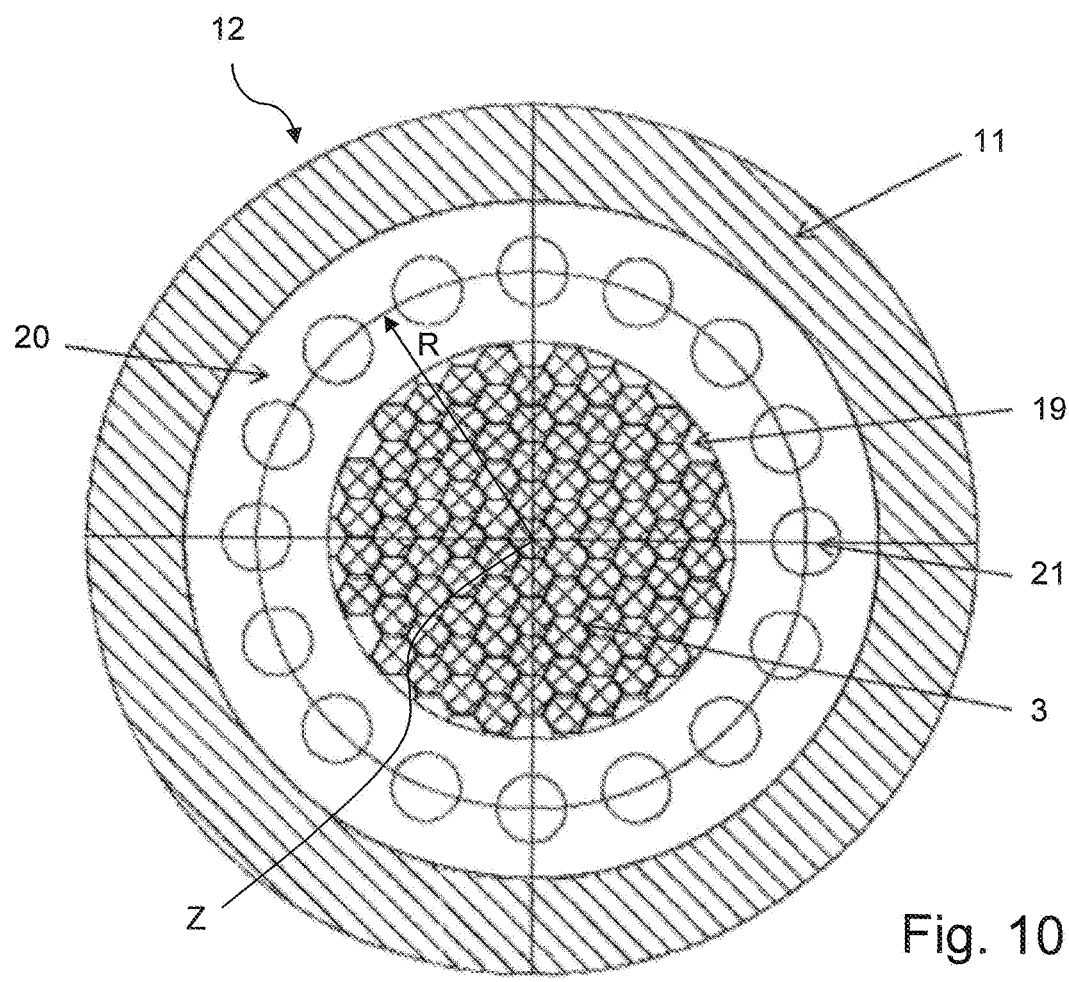
FIG. 10 A schematic cross-section (perpendicular to the longitudinal direction) through an eighth embodiment of an inventive superconducting wire, with a Cu sleeve in which NbTi substructures are each embedded at the same radius.

FIG. 10 shows a further embodiment of an inventive superconducting wire 12, comprising a Cu sleeve 20 with deep drill holes for NbTi substructures 21, in this case, NbTi rods. An NbTi rod provides a single superconducting electrical current path in the superconducting wire 12—that is, a single NbTi filament; alternatively, a multifilament substructure can also be provided as the NbTi substructure, for example, comprising a Cu matrix with several, typically nineteen or more, embedded NbTi filaments. The Cu sleeve 20 is here surrounded by a Cu enclosing tube 11, so that the Cu sleeve 20 can also be termed an intermediate sleeve. Cu—Al composite elements 3 are disposed within the Cu sleeve 20 (inside the central drill hole); any cavities at the edge can be filled in with Cu filler plates 19.

The NbTi substructures 21 are here disposed evenly in the Cu sleeve 20 in the azimuthal direction and all are located at the same radial distance (radius) R from the center Z of the superconducting wire 12. Considerable weight can be saved by using Cu—Al composite elements 3 in the central region ZB of the superconducting wire 12.

Figure 11:
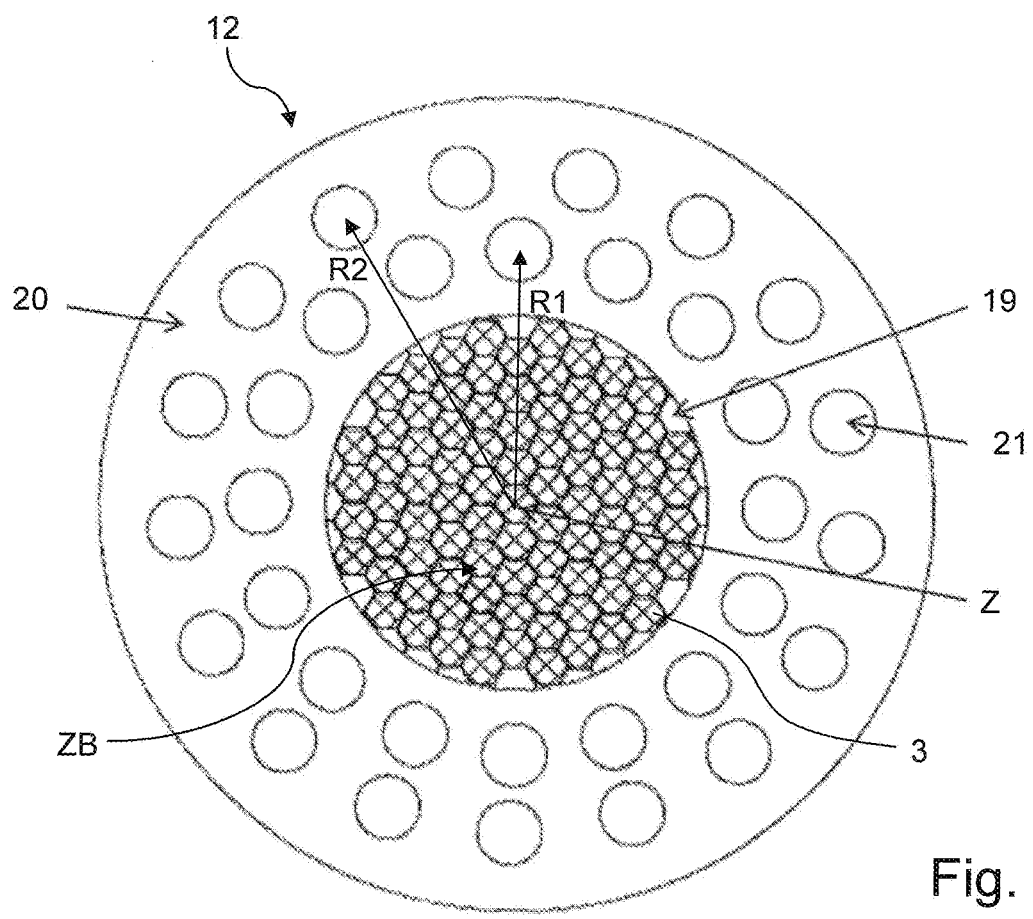
FIG. 11 A schematic cross-section (perpendicular to the longitudinal direction) through a ninth embodiment of an inventive superconducting wire, with a Cu sleeve in which NbTi substructures are embedded at two different radii.

The embodiment shown in FIG. 11 of an inventive superconducting wire 12 is constituted without a Cu enclosing tube; here the Cu sleeve 20 delimits the outside of the superconducting wire 12 directly. In the Cu sleeve 20, deep drill holes for NbTi substructures 21 are provided distributed at two radial distances (radii) R1, R2. The NbTi substructures 21 are disposed evenly distributed in the azimuthal direction at both radial distances R1, R2. Cu—Al composite elements 3 are disposed in the central region ZB of the superconducting wire.

To summarize, the invention describes NbTi superconducting wires, in which both aluminum and copper are used to stabilize NbTi superconducting filaments. The aluminum is disposed in Cu—Al composite elements with a hexagonal cross-section, which have an Al core and a Cu sheath. Preferably, aluminum is used exclusively in Cu—Al composite elements. In the individual composite elements, only slight reforming stress can build up, so that cracks are prevented from forming in the wire drawing processes that are required to produce the superconducting wire. In addition, the Cu—Al composite elements can be grouped within the superconducting wire, so that the configuration of Cu—Al composite elements in the circumferential direction is interrupted at regular intervals, for example, by NbTi sectors of NbTi elements. This further reduces reforming stress.

I claim:

1. A superconducting wire, the wire comprising:
   NbTi superconducting material; and
   a multiplicity of hexagonal elements, wherein, as seen in cross-section perpendicular to a longitudinal direction of the superconducting wire, said elements have a substantially hexagonal outer contour and at least a portion of said hexagonal elements is constituted as Cu—Al composite elements, wherein cross-sections of said Cu—Al composite elements each extend perpendicular to said longitudinal direction of the superconducting wire, said Cu—Al composite elements having an Al core and a Cu sheath that surrounds said Al core, wherein each Cu—Al composite element consists of 10-20% by volume of Cu, or of an alloy containing Cu, and 80-90% by volume of Al.

2. The superconducting wire of claim 1, wherein, as seen in cross-section perpendicular to said longitudinal direction of the superconducting wire, the superconducting wire has at least three Cu—Al sectors, each Cu—Al sector having a multiplicity of contiguous Cu—Al composite elements, wherein said Cu—Al sectors are azimuthally spaced or disposed in an azimuthally evenly distributed fashion.

3. The superconducting wire of claim 2, wherein at least three Cu—Al sectors border a central Cu—Al sector, said central Cu—Al sector having a multiplicity of contiguous Cu—Al composite elements and being disposed, as seen in cross-section perpendicular to said longitudinal direction of the superconducting wire, at a center of the superconducting wire.

4. The superconducting wire of claim 1, wherein the superconducting wire, as seen in cross-section perpendicular to said longitudinal direction of the superconducting wire, has at least three mutually separated Cu—Al clusters, each Cu—Al cluster having a multiplicity of contiguous Cu—Al composite elements.

5. The superconducting wire of claim 1, wherein a portion of said hexagonal elements is constituted as NbTi elements, said NbTi elements each having one or more NbTi filaments.

6. The superconducting wire of claim 5, wherein said NbTi elements each have a Cu matrix and/or a Cu enclosure.

7. The superconducting wire of claim 5, wherein, as seen in cross-section perpendicular to said longitudinal direction of the superconducting wire, the superconducting wire has at least three NbTi sectors, each NbTi sector having a multiplicity of contiguous NbTi elements, wherein said NbTi sectors are azimuthally spaced.

8. The superconducting wire of claim 1, wherein, as seen in cross-section perpendicular to said longitudinal direction of the superconducting wire, the superconducting wire has a central region which contains Al.

9. The superconducting wire of claim 8, wherein said central region has a multiplicity of contiguous Cu—Al composite elements.

10. The superconducting wire of claim 8, wherein a shaped tube or a Cu shaped tube delimits said central region.

11. The superconducting wire of claim 1, wherein the superconducting wire has a sleeve or a Cu sleeve into which multiple mutually separated NbTi substructures are embedded, each NbTi substructure having one or more NbTi filaments.

12. The superconducting wire of claim 11, wherein said NbTi substructures are azimuthally evenly distributed.

13. The superconducting wire of claim 11, wherein said NbTi substructures are disposed at a same radial distance from a center of the superconducting wire.

14. The superconducting wire of claim 11, wherein said NbTi substructures are distributed at two or more radial distances, six or more NbTi substructures being at a same radial distance from a center of the superconducting wire.

15. The superconducting wire of claim 1, wherein the superconducting wire comprises an outer enclosing tube or a Cu enclosing tube.

* * * * *